United States Patent [19]

Noguchi

[11] Patent Number: 5,382,537
[45] Date of Patent: Jan. 17, 1995

[54] METHOD OF MAKING THIN FILM TRANSISTORS

[75] Inventor: Takashi Noguchi, Kanagawa, Japan

[73] Assignee: Sony Corporation, Tokyo, Japan

[21] Appl. No.: 85,083

[22] Filed: Jul. 2, 1993

[30] Foreign Application Priority Data

Jul. 10, 1992 [JP] Japan .................. 4-183896

[51] Int. Cl.6 ........................... H01L 21/265
[52] U.S. Cl. ........................ 437/41; 437/21; 437/83; 437/101; 437/173; 117/3
[58] Field of Search ............ 437/21, 41, 83, 173, 437/201; 117/3

[56] References Cited

U.S. PATENT DOCUMENTS 4,727,044  2/1988  Yamazaki .................. 437/83
4,808,546  2/1989  Moniwa et al. ........... 437/41

FOREIGN PATENT DOCUMENTS 0095619  6/1982  Japan .................. 437/83
0155121  9/1984  Japan .................. 437/83
0036866  2/1987  Japan .................. 437/83
0140916  5/1990  Japan .................. 437/83
0185874  8/1991  Japan .................. 437/83
3178124  8/1991  Japan .................. 437/83

Primary Examiner—R. Bruce Breneman
Assistant Examiner—Ramamohan Rao Paladugu
Attorney, Agent, or Firm—Hill, Steadman & Simpson

[57] ABSTRACT

When a thin film transistor is formed by forming a polycrystalline silicon thin film of a large grain size, the uniformity of film quality within an active region can be improved more reliably, whereby a carrier mobility of a transistor can be suppressed from being fluctuated. Therefore, the thin film transistor can be enhanced in efficiency. There is provided a method of making a thin film transistor in which a dot-shaped core from which crystal is to be grown is produced on an amorphous silicon thin film at its predetermined location and solid phase growth is performed to grow crystal to thereby form a silicon thin film. The core from which crystal is to be grown is produced on the thin film transistor at its portion near the outside of a region in which an active region is formed.

11 Claims, 2 Drawing Sheets

METHOD OF MAKING THIN FILM TRANSISTORS

BACKGROUND OF THE INVENTION

1. Field of the Invention

The present invention relates to a method of making thin film transistors and, more particularly, to a method of making thin film transistors using silicon thin films.

2. Description of the Prior Art

In a static random access memory (SRAM) of high resistance load type or the like, in order to assure an operation margin, reliability, a stand-by current and so forth, there has been proposed a stack type SRAM that uses a thin film transistor (TFT) formed on a polycrystalline silicon which is superior in uniformity of the film quality as a load element.

Polycrystalline silicon can be formed by an ordinary chemical vapor deposition (CVD) method. Particularly, if it is intended to form a polycrystalline silicon film having crystal grains of a relatively large size, then it is difficult to form a polycrystalline silicon film which is superior in uniformity of the film quality and has a high carrier mobility with a low leak. Meanwhile, there is proposed a random solid phase growing method or a selective growing method in which a selective implantation of ions is performed at a high dose by using a resist mask after the implantation of ions was performed at a low dose to thereby produce a core from which crystal is to be grown and then a low temperature solid phase growing processing is carried out. According to such solid phase crystallization (SPC) technique, a grain size of polycrystalline silicon can be increased so that a high carrier mobility is made possible. Therefore, the application, research and trial manufacturing of the above-mentioned TFT stack-type SRAM or the like are expanded by this solid phase crystallization technique.

Meanwhile, with the random solid phase growing method, since it is difficult to grow crystal selectively, it sometimes occurs that a channel of a transistor extends to a grain boundary. If this actually occurs, then a dispersion occurs in leak current or threshold voltage, which deteriorates the reliability of the transistor. Moreover, with the method of selectively forming a single crystal silicon region, also the problems of pollution of resist are involved and a low dose region is non-uniform, which deteriorates the uniformity of the film quality.

The assignee of the present application has previously proposed a semiconductor crystal growing method (see Japanese patent application No. 3-285702). With this previously-proposed method, after a shield mask was formed on the upper face of an amorphous semiconductor layer formed on a substrate, an excimer laser light is irradiated on the amorphous semiconductor layer through the shield mask to produce on the amorphous semiconductor layer a core from which crystal is to be grown, whereafter crystal is grown from the core for the crystallization by a low temperature solid phase annealing process to thereby form a single crystal region on the amorphous semiconductor layer.

According to the aforesaid method, the single crystal region of high quality can be selectively grown on the amorphous semiconductor layer and the channel layer of the transistor cannot be extended to the grain boundary. Accordingly, a leak current can be reduced considerably and a carrier mobility can be increased. Also, the fluctuation of a threshold voltage can be suppressed and the transistor thus produced is high in reliability.

OBJECTS AND SUMMARY OF THE INVENTION

In view of the aforesaid aspects, it is an object of the present invention to provide a method of making thin film transistors in which when a thin film transistor is produced by forming a polycrystalline silicon thin film of a large grain size, uniformity of the film quality within an active region can be realized more positively to suppress a carrier mobility in the transistor from being fluctuated.

It is another object of the present invention to provide a method of making thin film transistors in which a mutual conductance of a transistor can be increased.

It is still another object of the present invention to provide a method of making thin film transistors in which a leak current and a threshold voltage can be suppressed from being fluctuated.

It is a further object of the present invention to provide a method of making thin film transistors in which thin film transistors of high reliability can be obtained.

It is yet a further object of the present invention to provide a method of making thin film transistors by which efficiency of a transistor can be enhanced.

According to an aspect of the present invention, there is provided a method of making a thin film transistor in which a dot-shaped core from which crystal is to be grown is produced at a predetermined location of an amorphous silicon thin film and a solid phase epitaxy or solid phase growing processing is performed to form a silicon thin film which comprises the steps of forming the core for crystallization near a portion outside of a portion in which an active region of the thin film transistor is formed, and growing crystal by the solid phase epitaxy.

According to another aspect of the present invention, there is provided a method of making a thin film transistor in which a dot-shaped core from which crystal is to be grown is produced at a predetermined location of an amorphous silicon thin film and a solid phase epitaxy or solid phase growing processing is performed to form a silicon thin film which comprises the steps of forming the core for crystallization in a source region or drain region, and growing crystal by the solid phase epitaxy.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

A method of making thin film transistors according to an embodiment of the present invention will now be described with reference to FIGS. 1A to 1C. In this embodiment, a method of forming a silicon thin film proposed in Japanese patent application No. 3-285702 is applied to the present invention. In this embodiment, after an amorphous silicon thin film was formed, an excimer laser light is irradiated upon the amorphous silicon thin film to produce a core for the crystallization, whereupon a silicon thin film is formed by a low temperature solid phase annealing processing.

Figure 1A:
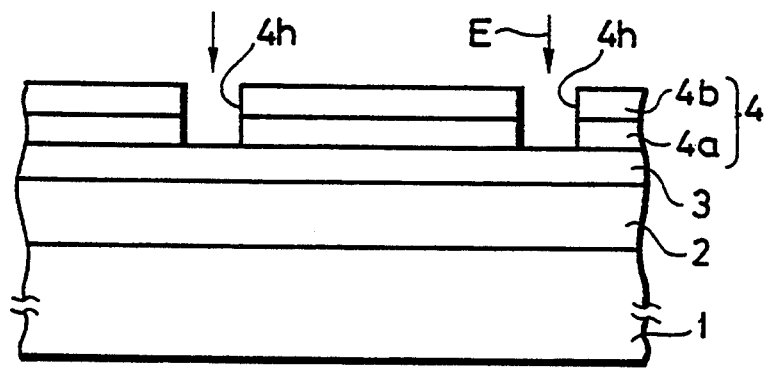
FIGS. 1A to 1C are schematic sectional views illustrative of different steps of a method of making a thin film transistor according to an embodiment of the present invention.
Figure 1B:
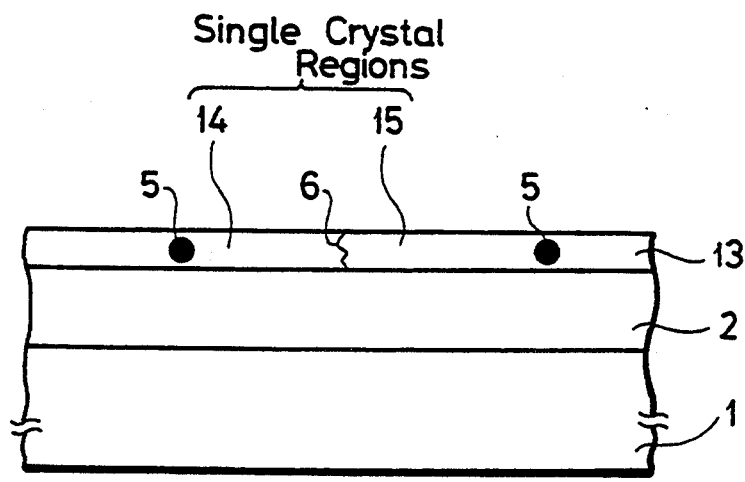

As shown first in FIG. 1A, an insulating film 2 made of $SiO_2$ or the like is formed on an upper face of a substrate 1 made of Si by an LPCVD (low pressure chemical vapor deposition) method. Subsequently, an amorphous silicon thin film 3 is formed with a thickness of, for example, 40 nm on an upper face of the insulating film 2 by the LPCVD method, a plasma CVD method or the like using mono-silane ($SiH_4$) or disilane ($Si_2H_5$) as reaction gas.

At that time, a polycrystalline silicon layer is formed on the upper face of the substrate 1 by the CVD method. Then, ions of $Si^+$ are implanted into the subsequently formed polycrystalline silicon layer and this polycrystalline silicon layer may be formed as the amorphous silicon thin film 3.

Alternatively, the insulating film 2 made of $SiO_2$ or the like may not be formed on the upper face of the substrate 1 but the amorphous silicon film 3 may be formed on the substrate 1 made of quartz glass or the like by the CVD method similarly to the above-mentioned steps.

Subsequently, a shield mask layer 4 formed of a silicon dioxide layer 4a having a thickness of about 500 nm and a silicon layer 4b having a thickness of about 100 nm is formed on the upper face of the amorphous silicon thin film 3 by the CVD method, for example. In this case, the thickness of the silicon dioxide layer 4a is selected such that heat of excimer laser light thermally converted on the silicon layer 4b by the irradiation of excimer laser light can be sufficiently escaped through the silicon dioxide layer 4a. Further, the thickness of the silicon dioxide layer 4a is selected so as to prevent the excimer laser beam from being passed therethrough, and may be about 80 nm or more.

Then, an etching mask of resist not shown is formed on an upper face of the silicon layer 4b by a photolithography technique or the like. Subsequently, by using the resist mask, the silicon dioxide layer 4a and the silicon layer 4b are anisotropically etched to remove portions of the silicon layers 4a and 4b by an anisotropy etching such as an RIE (reactive ion etching) or the like. Consequently, through-holes 4h are formed at the position, whereat cores for the crystallization are to be produced. Each of the through-holes 4h of a circular pattern is formed at the center of a region of the core from which crystal is to be grown, which is formed by the steps that will be described later on. Preferably, the through-hole 4h has a diameter smaller than about 1.0 μm. When the through-holes 4h are formed with the diameter equal to or greater than 1.0 μm, polycrystalline silicon will be grown at the locations of the through-holes 4h by the low temperature solid phase growing processing.

Subsequently, as shown by an arrow E in FIG. 1A, the excimer laser light is irradiated on the amorphous silicon thin film 3 through the shield mask layer 4. Then, at the portion that is irradiated with the excimer laser light via the through-holes 4h, there are formed cores 5 from which crystal is to be grown, as shown by solid circles in FIG. 1B. The energy density of the excimer laser light to be irradiated is set to a level at which the amorphous silicon layer 3 is not crystallized in accordance with the thickness of the amorphous silicon thin film 3. When the thickness of the amorphous silicon thin film 3 is 40 nm, for example, the energy density of the excimer laser light is about 160 $mJ/cm^2$.

Subsequently, the shield mask layer 4 is removed by suitable means which does not damage the amorphous silicon thin film 3, such as wet etching or plasma etching. Then, the low temperature solid phase annealing processing is performed, for example, by keeping the substrate 1 for 40 hours at the temperature of 600° C. in an atmosphere of nitrogen (Ng) in an electric furnace, thereby forming a silicon thin film 13 in which single crystal regions 14, 15 are formed about the core 5 from which crystal is to be grown, as shown in FIG. 1B. In FIG. 1B, reference numeral 6 depicts a grain boundary formed at a location at which the single crystal regions 14 and 15 contact with each other.

Figure 1C:
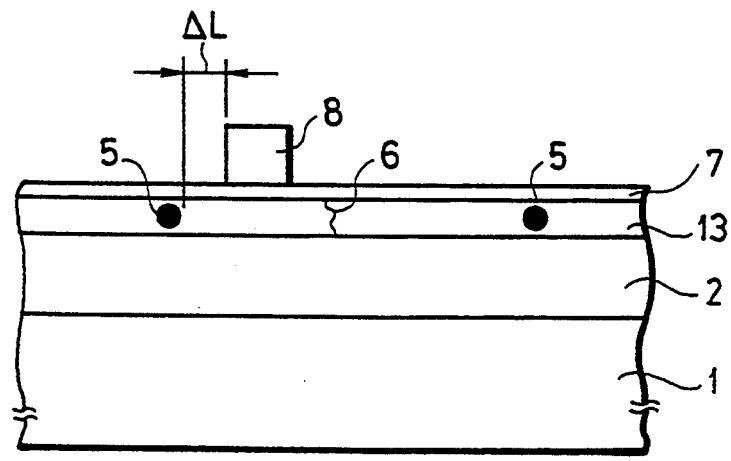

Subsequently, as shown in FIG. 1C, an insulating layer 7 such as $SiO_2$ or the like is formed on the silicon thin film 13, and a gate electrode 8 is formed on the insulating layer 7 by the application of some suitable method such as the photolithography technique or the like so that a spacing ΔL from the core 5 for the crystallization is selected to be 1 to 2 μm, e.g., 1 μm. In this way, the core 5 from which crystal is to be grown is not formed below the gate electrode 8 at its portion which serves as an active region 9c, and the active region 9c is reliably included within the single crystal regions 14, 15. Then, though not shown, the implantation of ions is performed on both sides of the gate electrode 8 to form a source/drain region, thereby the thin film transistor being formed.

Figure 2:
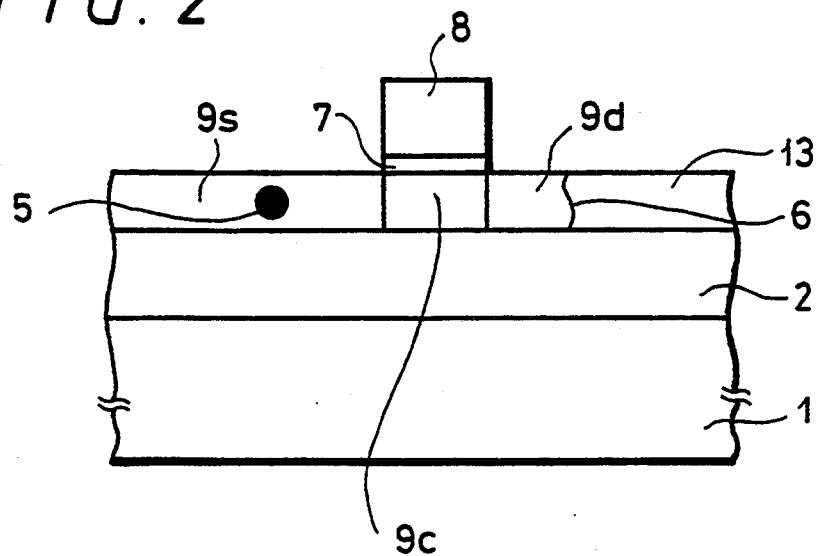
FIG. 2 is a schematic sectional view illustrative of a step of the method subsequent to the step shown in FIG. 1C.
Figure 3:
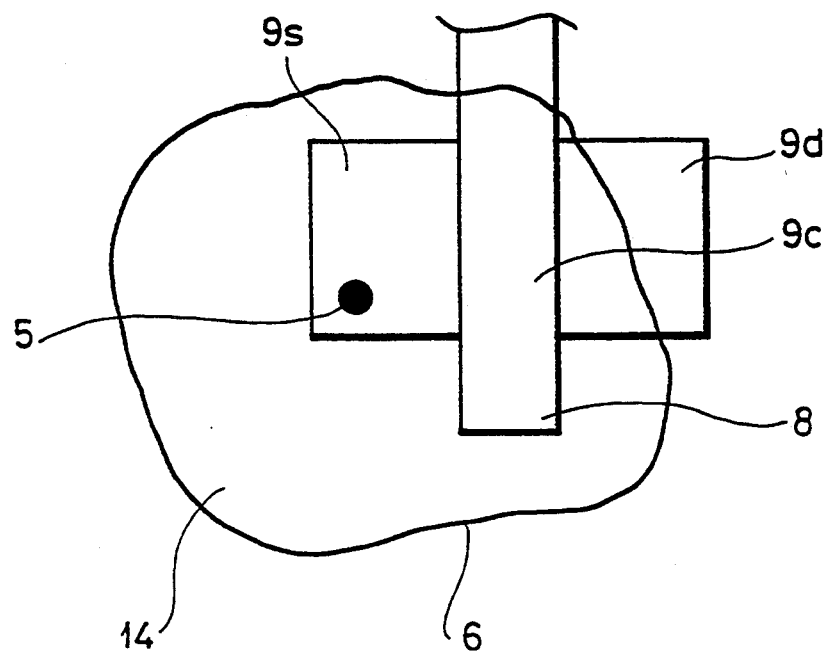
FIG. 3 is a schematic plan view illustrating an example of the thin film transistor according to the embodiment of the present invention in an enlarged scale.

More specifically, as shown in FIG. 2, the core 5 from which crystal is to be grown is formed in a source region 9s, i.e., the active region 9c is reliably included within the single crystal region 14 as shown in FIG. 3 which is a schematic enlarged plan view of FIG. 2. In this case, the active region 9c can be formed as the single crystal region similarly when the core 5 from which crystal is to be grown is formed within a drain region 9d.

The active region 9c formed within the single crystal region becomes excellent in uniformity of the film quality. Therefore, it is possible to obtain a thin film transistor which has a high carrier mobility μ with a low leak. Accordingly, the thin film transistor of the present invention has a large mutual conductance gm. Further, since no grain boundary exists in the active region, i.e., the channel region, a swing value can be reduced by decreasing a trap density and an on-state current can be increased. Also, a leak current and a threshold voltage can be suppressed from being fluctuated.

While the irradiation of the excimer laser light is performed to form the core from which crystal is to be grown as described above, the present invention is not limited thereto and can be applied to the cases such that the thin film transistor is formed by using various methods, such as a method of selectively implanting ions of silicon at a high dose after the implantation of ions of silicon was performed at a low dose to thereby produce a core from which crystal is to be grown or a method of producing a core from which crystal is to be grown by using an electron beam or focused ion beam.

As described above, according to the present invention, since the active region is reliably formed within the single crystal region, there can be obtained the thin film transistor of low leak current and high carrier mobility. Further, the mutual conductance of the transistor can be increased and the swing value can be reduced, accordingly, the on-current can be increased. Therefore, the efficiency of the thin film transistor of the present invention can be enhanced. Furthermore, the leak current and the threshold voltage can be suppressed from being fluctuated. Therefore, it is possible to obtain the thin film transistor of high reliability.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A method of making a thin film transistor, comprising the steps of:
   at a position along an amorphous thin film silicon layer, forming a dot-shaped crystallization core in said amorphous thin film silicon layer, which core has a diameter less than the thickness of said thin film silicon layer:
   forming in said thin film layer by solid phase epitaxy, a single crystal region about said core:
   forming on said thin film silicon layer at a position spaced from said position of said core, a gate electrode of a thin film transistor whose active region lies within said single crystal region, thereby omitting said core from within said active region, and forming in said thin film silicon layer at opposite sides of said gate electrode, source and drain regions.

2. The method of claim 1, wherein said core is circular in shape.

3. The method of claim 1, comprising the further step of forming said amorphous silicon thin film layer by a chemical vapor deposition method.

4. The method of claim 1, wherein said amorphous silicon thin film layer is formed by a low pressure chemical vapor deposition method.

5. The method of claim 1, wherein said amorphous silicon thin film layer is formed by a plasma chemical vapor deposition method.

6. The method of claim 1, comprising the further step of forming the amorphous silicon thin film layer by first forming polycrystalline layer by a chemical vapor deposition method and then implanting silicon ions into the polycrystalline silicon layer.

7. The method of claim 1, wherein said core is formed by eximer laser irradiation.

8. The method of claim 1, wherein said source and drain regions are formed by ion implantation.

9. The method of claim 1, wherein said step of forming said single crystal regions, comprises the steps of:
   forming a shield mask over the amorphous silicon layer;
   forming an etching mask over the shield mask;
   etching through holes in the shield mask;
   forming said cores by accessing said amorphous silicon layer through said through holes;
   removing masks; and
   subjecting said amorphous silicon layer to low temperature solid phase annealing.

10. The method of claim 9, wherein said through holes have diameters no greater than 1.0 $\mu$m.

11. The method of claim 9, wherein the shield mask comprises a silicon dioxide film and the etching mask comprises a silicon film.

* * * * *